United States Patent [19]

Lindmayer

[11] 4,240,842
[45] Dec. 23, 1980

[54] SOLAR CELL HAVING CONTACTS AND ANTIREFLECTIVE COATING

[75] Inventor: Joseph Lindmayer, Bethesda, Md.

[73] Assignee: Solarex Corporation, Rockville, Md.

[21] Appl. No.: 24,784

[22] Filed: Mar. 28, 1979

Related U.S. Application Data

[63] Continuation-in-part of Ser. No. 3,945, Jan. 16, 1979.

[51] Int. Cl.² .............................................. H01L 31/04
[52] U.S. Cl. ..................................... 136/256; 357/30; 357/65; 427/88; 427/191; 427/192
[58] Field of Search ................. 136/89 CC; 357/30, 65

[56] References Cited

U.S. PATENT DOCUMENTS 3,982,964  9/1976  Lindmayer et al. ................... 136/89
4,003,770  1/1977  Janowiecki ........................... 148/174

OTHER PUBLICATIONS

A.D. Haigh, "Fired Through Printed Contacts on Antireflection Coated Silicon Terrestrial Solar Cells," *Conf. Record, 12th IEEE Photovoltaic Specialists Conf.* (1976) pp. 360-361.

L. Frisson et al. "Screen Printed Contacts on Silicon Solar Cells with Low Series Resistance," *Conf. Record, 13th IEEE Photovoltaic Specialists Conf.* (1978) pp. 590-592.

*Primary Examiner*—Aaron Weisstuch
*Attorney, Agent, or Firm*—Watson, Cole, Grindle & Watson

[57] ABSTRACT

A photovoltaic cell is formed by applying electrical contact material through an antireflective coating on the light receiving surface of the cell by flame, arc or plasma spraying. The cell so formed has a metal contact spaced portions of which are in electrical contact with the light-receiving surface of the cell.

6 Claims, 4 Drawing Figures

SOLAR CELL HAVING CONTACTS AND ANTIREFLECTIVE COATING

This application is a continuation-in-part of my application Ser. No. 3945, filed Jan. 16, 1979 in the name of Joseph Lindmayer and entitled, Method of Applying Electrical contacts to a Photovoltaic Cell and Product Formed Thereby.

The present invention relates in general to photovoltaic cells having electrical contacts on their front and back surfaces as well as an antireflective coating on the front, lightreceiving surface of the cell. More specifically, it relates to a cell and method of making the same in which a grid or other pattern of contacts is formed on the front surface of the cell, which also carries an antireflective coating to increase the concentration of light that will be absorbed by the cell rather reflected away.

In the foregoing application of which the present application is a continuation-in-part, I have described photovoltaic cells that are of a general type well known in the art. In those cells a host material, e.g., monocrystalline silicon, has been doped with a suitable impurity so that the doped wafer has p or n characteristics. Thereafter, an impurity of a conductivity type opposite to that of the dopant is diffused or otherwise applied to the doped wafer to form a p-n photovoltaic junction at or closely adjacent to the front, light-receiving surface of the wafer. When light energy impinges on the front, light-receiving surface of the cell, electron-hole pairs are formed in the silicon. Because of the presence of the p-n junction, which term is meant to include both p-n and n-p junctions, electrons will be directed toward one or the other of major surfaces of the cell, and holes toward the other major surface. In a typical n-p cell, electrons are directed to the front, light-receiving surface of the cell and holes toward the back surface. To make the cell operable it is typically necessary to apply electrical contacts to both the front and back surfaces of the cell so that electrons excited by impingement of light of the silicon or other host material will be conducted away from the cell and, after causing work to be done, back to the cell to complete the circuit.

Many problems associated with the application of an electrically conductive grid to the surface of a photovoltaic cell have been mitigated in accordance with the invention disclosed and claimed in aforementioned parent application. In that application a method is described in which a contact is applied to the surface of a photovoltaic cell by forming particles of electrically conductive material, generally a metal, at a temperature in excess of the alloying temperature of the material and silicon, when silicon is the host material for the cell. The particles are then sprayed onto a surface of the cell at a distance such that the particles will contact the surface at a temperature at which they will become adhered to the silicon or other host material from which the cell is formed. Preferably, electrical contact between the silicon and the contact material is accomplished without deep alloying when the contact is being applied to the front surface of the cell. True alloying may take place. However, use of the term "alloying" is not limited to a strict, technical definition of the term but includes adherence at somewhat lower temperatures where the mode of adherence might better be termed "sintering". Such methods of spraying have become commonly known as flame spraying, arc spraying or plasma spraying. Common to all three forms is the fact that fine particles, atoms or ions of a metallic material, such as aluminum, are directed toward the work surface, in this case the surface of a solar cell. Consequently, for the purposes of the present invention these three forms of spraying will be used synonymously and the disclosure of such spraying in my parent application is desired to be incorporated by reference herein where requisite.

While that application Ser. No. 3945, filed Jan. 16, 1979, did avoid some problems of the art in applying contacts, nonetheless it was not specifically directed to those problems that are inherent in the application of electrical contacts to solar cells that are to have an antireflective coating applied in conjunction with the application of electrical contacts. Thus, my U.S. application Ser. Nos. 740,670, filed Nov. 10, 1976, now U.S. Pat. No. 4,156,622, and 838,093, filed Sept. 30, 1977 may be referred to for a method of applying an antireflective coating to a solar cell. That application, for example, as well as U.S. Pat. No. 3,533,850 to Tarneja et al., and U.S. Pat. No. 3,922,774 to me and Allison, relate to the application of antireflective coatings to solar cells. In particular, in my own pending applications I describe a novel method of forming a $Ta_2O_5$ layer of antireflective coating on a solar cell.

As is known in the art, the index of refraction of a silicon wafer is approximately 4.0 when light enters a solar cell comprising a silicon wafer from the air, it has traveled in a medium that has an index of refraction of unity. Consequently, due to the differences in indices of refraction, a substantial percentage of the incident light is reflected away from the cell rather than absorbed by it. It is known that certain materials, when applied as a coating on the solar cell, and particularly to the front, light-receiving surface of that cell, will provide the necessary refractive index that will reduce reflection, while at the same time not otherwise adversely affecting operation of the solar cell. It is known that the index of refraction of an antireflective coating that will be optimal for reducing reflection is preferably greater than 2 for silicon cells. While antireflective coatings may be formed from titanium dioxide, tantalum oxide, cerium oxide, niobium oxide, zinc sulfide and tin oxide, my personal predilection is for the use of tantalum oxide as the preferred material from which an antireflective coating is to be formed. However, for the purpose of the present invention, the specific antireflective coating is not believed to be of critical importance, although my experimentation has been concentrated on tantalum oxide.

In any case, there are nevertheless several problems that arise in conjunction with applying contacts to a cell, specifically to the front surface of the cell, in conjunction with the application of an antireflective coating to that light-receiving surface. Thus, a standard method of applying a tantalum or tantalum pentoxide layer to the light-receiving surface of photovoltaic cell is to deposit either tantalum pentoxide or elemental tantalum or, in accordance with one aspect of my pending applications, a mixture of the two, on the surface of the cell by electron beam evaporation. Yet any method of deposition of a material that requires a vacuum will not lend itself to continuous assembly-line operation, if for no other reason than because vacuum deposition generally requires that batches of cells be placed in a vacuum chamber. In that chamber, time is required for a vacuum to be drawn, deposition to take place, then the vacuum released and the batch withdrawn from the chamber. Any such vacuum deposition step in a method of making photovoltaic cells is, therefore, highly deleterious to the production of relatively inexpensive photovoltaic cells.

One object of my co-pending application Ser. No. 3945 is to avoid a vacuum deposition step in the formation of electrical contacts on, inter alia, the front surface of a cell. Since such vacuum deposition has also been a normal way of applying a tantalum pentoxide or other antireflective coating to that front surface, it would also be highly desirable to avoid having to utilize such a vacuum deposition step in forming that coating. While there are other ways known to apply the antireflective coating, or at least ways that seem feasible, e.g., spin coating, fine nozzle spraying, silk screening and the like, any such application requires a clean, relatively smooth surface on which the antireflective coating is to adhere. As a consequence, while, e.g., spinning on a coating is a highly desirable way to apply an antireflective coating to a solar cell, when such a formulation is applied to a cell that already carries electrical contacts, problems arise because the surface to be coated will be disrupted by the upstanding contacts. Further, after an antireflective coating has been applied to the cell, the coating must be fired at relatively high temperatures, e.g., 400° C. up to 800° C., to obtain complete oxidation of the tantalum in the coating solutions. At such high temperatures the metallic contacts that are already adhered or alloyed to the silicon, tend to undergo changes that can result in a diminution of the efficiency of the cell, possibly due to damage to the p-n junction.

Additionally, a phenomenon has been noted when electrical contacts, e.g., aluminum, are applied in the normal manner to the light-receiving surface of a solar cell, even when applied by arc or flame spraying according to the invention of my U.S. Pat. application Ser. No. 3945. Thus, when a front surface electrical contact, usually in the form of network or grid, is applied in a normal way to the light-receiving surface of a cell, a reverse current of the diode is effected with a concomitant tendency to lower the photovoltage. Areas of the solar cell covered by electrical contacts tend to have a high reverse current, and it would appear advantageous to minimize the area of contact such as by providing for distributed point contacts between the metal and the semiconductor material. In this manner there would be a lessening of reverse current, but the electrical conductivity would not be substantially impaired.

As a consequence, it is among the objects of the present invention to provide a solar cell and method for forming same in which the antireflective coating may be applied other than by an evaporation or vacuum deposition step that requires batchtype procedures. It also is an object of my invention to form such antireflective coating where, when the coating must be fired at substantially elevated temperatures in order to ensure complete oxidation of the coating metal, that the antireflection coating step will be carried out before the electrical contact has been applied to the cell surface. As another object, it is desired to apply electrical contacts to the surface of the solar cell by a method other than one that involves deposition from a vacuum, and, even more preferably, to so apply those contacts that they will be discontinuously joined to the cell surface.

I have discovered a method of accomplishing all the foregoing objects substantially concomitantly, and that method basically comprises applying an antireflective coating to the lightreceiving surface of the cell, preferably by other than vacuum deposition, and then spraying particles of high temperature metal on the coated surface of the cell at such a distance and temperature that the particles sprayed will contact the coating, permeate it, and thereafter contact the surface of the cell and form point contacts with the silicon.

When the surface to which both the antireflective coating and electrical contacts in the form of a grid or network are to be applied is the front surface of the cell, the temperature at which the particles are applied to the cell will be such that the underlying p-n junction is not substantially damaged. Also in such instance, masking means is utilized to cause the particles to be deposited on the coating in a grid pattern. One particularly advantageous masking means is utilized by applying a paint or ink to those portions of the antireflective coating that are not to be contacted by the hot particles of contact material. In this mode, which effectively is a negative screening, the contact material will be applied to unpainted portions of the antireflective coating, and thereupon penetrate the coating until the particles come into contact with the front surface of the cell. In the application of the antireflective coating, it is preferred that such coating be applied by spinning, after which the coating is heated to remove the solvent in the coating, and then is fired to fix the antireflective coating on the cell surface and complete oxidation thereof.

The photovoltaic cell so produced has a front, light-receiving surface and an antireflective coating overlying and adhered to that surface. Most preferably, at the present time, the antireflective coating is formed of tantalum pentoxide. Overlying and adhered to that coating is a grid or network of electrically conductive material that, at spaced porions thereof, extends through the antireflective coating and contacts the lightreceiving surface of the cell. In this structure the electrical contacts are preferably not covered by the antireflective coating on the upwardly extending portion of those contacts, which are exposed. Thus, a cell has been produced in which reverse current has been minimized while the application of both that antireflective coating and the electrical contacts has been carried out by other than the use of a vacuum chamber.

These and oher objects, features and advantages of the present invention will be rendered more readily apparent by reference to the diagramatic illustrations of a preferred embodiment of my method and product as illustrated in the accompanying drawing, which forms a part hereof, and in which.

Figure 1:
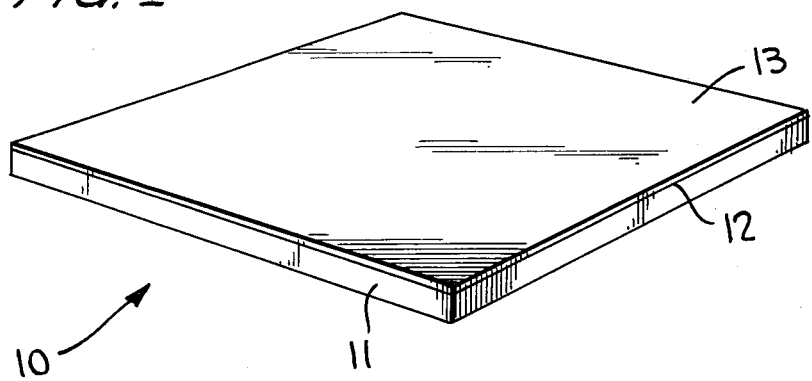
FIG. 1 is a perspective view of a wafer of silicon to which a layer of antireflective coating has been applied.

Referring to the drawings and in particular to FIG. 1 thereof, shown is a wafer 10 of silicon adapted to have contacts placed on the front surface thereof. The wafer has a body of silicon 11 in which a p-n junction (not shown) has been formed. On the front, light-receiving surface 12 of the wafer 10, a layer of an antireflective coating 13 has been applied to completely cover the front surface 12.

In the best mode of my invention as presently performed, the antireflective coating is spun onto the surface of the cell by putting a few drops of a liquid onto a spinner chuck, which is then rotated at a speed of about 3000 to 4000 rpm. This leaves a uniform coating of material on the surface of the cell. The specific antireflective coating solution that is presently used on the spinner chuck is a product sold by Allied Chemical Corp. under the brand mark TA-151. That coating was then baked for about 15 seconds at approximately 90° C. to dry off the solvent in the commercial product, then fired at about 450° C. for 60 seconds to convert all of the tantalum in the commercial product to tantalum pentoxide and firmly adhere that antireflective composition to the surface of the wafer. The optimum thickness of the antireflective coating using TA-151, which is a solution containing tantalum, was 600A, which was one-quarter of the designated wave length. Three spin-ons of TA-151 liquid from the spinner chuck were required to achieve that thickness. While it is possible to spray or even silk screen the antireflective coating on the cell, a spin-on is presently preferred particularly when, as here, the coating is easily spun onto the front surface 12 of the silicon body 11, which surface was substantially clean and uninterrupted, e.g., as by contacts.

Figure 2:
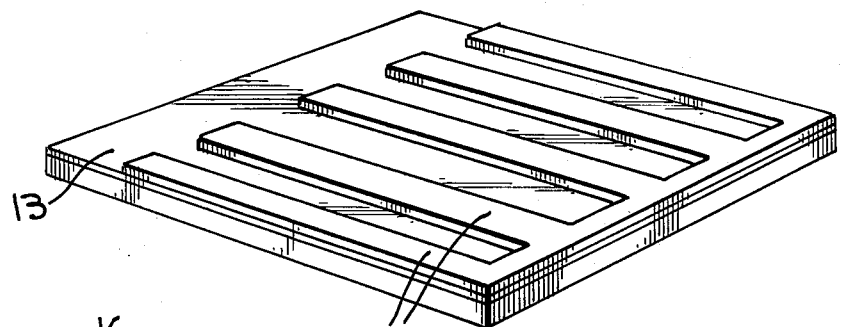
FIG. 2 is perspective view, partly broken away, of the wafer of FIG. 1 to which a masking means has been applied.
Figure 3:
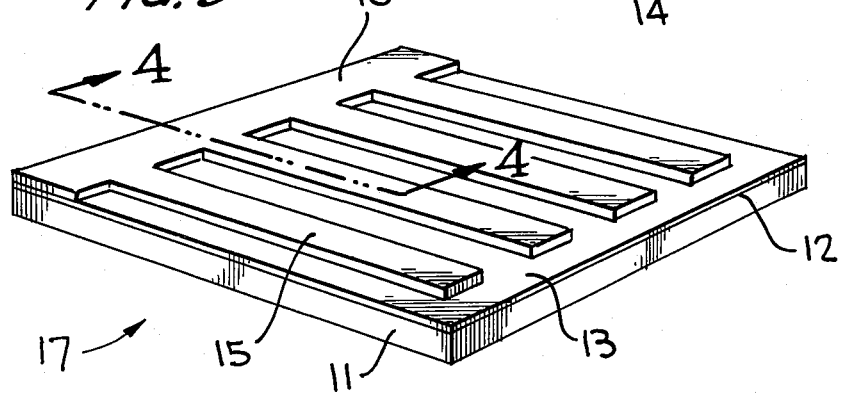
FIG. 3 shows the wafer of FIG. 2 with an electrically conductive contact applied to those areas of FIG. 2 that have not been painted, and with the paint then removed.

In order to form a grid or network that comprises the front electrical contact of the cell, many types of masks can be used, e.g., a shadow mask or photolithographic means. In the present instance, it was preferred to use a negative silk screening process, which means that paint or ink was applied to the antireflective layer 13 through a screen to form the areas that would not be covered by the contact. As shown in FIG. 2 merely for the purpose of illustration, paint has been applied to the antireflective coating layer 13 to form upstanding bars 14 of paint on the coating 13. Then, by means of arc spraying, flame spraying or plasma spraying, all in the same manner as that described in my copending application Ser. No. 3945, a body of electrically conductive contact material, preferably aluminum, is formed on those areas of the surface of the anitreflective coating 13 not covered by paint shield 14. After the contact material has been permitted to cool, the entire wafer is dipped in a solvent for the paint, in this case acetone, leaving a structure substantially as illustrated in FIG. 3. As there seen, the coating 13 now has a body of contact material applied to it, said contact material being in the form, for purposes of illustration only, of elongated fingers 15 each of which terminates at a collector bar 16. In this manner an electrical contact has been alloyed or at least adhered to the front surface of the solar cell, which surface bears an antireflective coating 13.

In order that one skilled in this art may not have to consult standard sources for materials, I further explain that the ink or paint used to form the masking means was Wornow Plating Resist No. PR-1000, marketed by Wornow Products, City of Industry, CA. Arc spray equipment utilized was sold by Tafa Thermal Spray Equipment, of Bow, N.H. The pistol is model 375 EFS, the control is model 47-51, and the power supply is model 30-8A. Operation was conducted at an air pressure of 90 p.s.i., at 38 volts and 25 amps. The spray was in one-half second bursts, with about 20 to 30 bursts being required. The gun was held about 16 to 20 inches from the cell during arc spraying.

Figure 4:
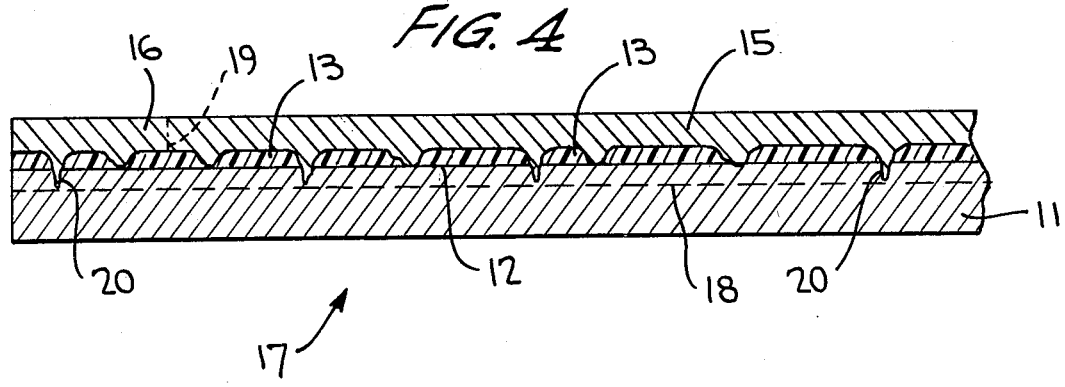
FIG. 4 is a sectional view taken along the line 4—4 of FIG. 3 diagramatically illustrating a cell according to my invention.

Details of the structure of what is now a solar cell 17, lacking only back contacts and connecting wiring to be able to generate electricity, are best seen in FIG. 4. As will be apparent, the cell 17 is formed of a silicon body 11 that is so doped that a p-n junction 18 has been formed near the front surface 12 of the body 11. Since FIG. 4 is a longitudinal sectional view directly through one of the electrically conductive fingers 15 as well as the contact bar 16, a finger 15 and contact bar 16 are proportionally indicated in FIG. 4, although the line of demarcation between them is illustrated only by phantom line 19. As shown in FIG. 4, the finger 15 and collector bar 16 have at spaced locations permeated and passed through the layer of antireflective coating 13 so that they form discontinuous point contacts 20 that are in electrical contact with the front surface 12 of the silicon body 11.

As stated, the spraying precedure whereby the fingers 15 and bus bar 16 are applied to the antireflective surface of the cell is disclosed more fully in my copending application Ser. No. 3945. While aluminum is the preferred material, as set forth therein, other materials may also be utilized, provided that they are electrically conductive. The gun from which the molten metal particles issue must be close enough to the wafer and its antireflective coating so that, depending upon the material used, the temperature to which the material is heated, and the distance from the gun to the antireflective coating, the result illustrated in FIG. 4 of the drawing will be accomplished.

Since the disclosure, where necessary, of my application Ser. No. 3945 is specifically incorporated herein by reference, the entirety of the disclosure thereof will not be repeated. However, it will be apparent that materials other than aluminum may be utilized to form electrical contacts, and that masking means other than a paint may be employed. However, it is of importance to the present invention that the electrically conductive contact material adhere not merely to he antireflective coating that covers the front, light-receiving surface of the cell, but that it extend down through that coating into contact with the silicon body 11 of the cell, itself. In this manner not only may the electrical contact material be firmly adhered to the cell, but it is not covered by antireflective coating and its contact with the silicon body is effected at spaced locations, thereby mitigating the magnitude of reverse current. The antireflective coating and the front contacts have been applied without the necessity of any vacuum deposition procedure, although so far as the application of the antirelective coating is concerned, it can be applied by a vacuum deposition procedure and still fall within the ambit of what I consider to be my invention.

While the present invention has been described with respect to a preferred mode thereof, it will be apparent that numerous alterations and modifications will be apparent to those skilled in the art without departing from the spirit of the invention. As to all such obvious alterations and modifications, it is desired that they be included within the purview of my invention, which is to be limited only by the scope, including equivalents, of the following, appended claims.

I claim:

1. A photovoltaic cell having a front surface adapted to receive light impinging thereon, an antireflective coating overlying and adhered to a major portion of said surface, and an electrical contact in the form of a pattern covering a minor portion of said surface and said coating, said contact having relatively small portions thereof extending through said coating and being in electrical contact with spaced portions of said light-receiving surface of said cell, said antireflective coating other than that part covered by said contact being continuous and uninterrupted.

2. A photovoltaic cell as claimed in claim 1, in which said electrical contact is composed of linear segments at least one of which has spaced portions thereof in electrical contact with said light-receiving surface of said cell, said antireflective surface between said linear segments being continuous and uninterrupted.

3. A photovoltaic cell as claimed in claim 2, in which said contact is exposed to ambient conditions at its upper surface and said coating adjoins but does not cover said upper surface.

4. A photovoltaic cell as claimed in claim 2, in which said antireflective coating is comprised of tantalum pentoxide.

5. A photovoltaic cell as claimed in claim 2, in which said contact is formed from aluminum.

6. A photovoltaic cell as claimed in claim 1, in which said electrical contact is comprised of aluminum.

* * * * *